(12) United States Patent
Channegowda et al.

(10) Patent No.: US 12,706,242 B2
(45) Date of Patent: Aug. 11, 2026

(54) INDUCTORS FOR DIRECT CURRENT (DC) CIRCUIT BREAKERS IN AIRCRAFT APPLICATIONS

(71) Applicant: Hamilton Sundstrand Corporation, Charlotte, NC (US)

(72) Inventors: Parikshith Channegowda, Marlborough, CT (US); Bo Liu, Vernon, CT (US); Xin Wu, Glastonbury, CT (US)

(73) Assignee: HAMILTON SUNDSTRAND CORPORATION, Charoltte, NC (US)

( * ) Notice: Subject to any disclaimer, the term of this patent is extended or adjusted under 35 U.S.C. 154(b) by 527 days.

(21) Appl. No.: 18/317,880

(22) Filed: May 15, 2023

(65) Prior Publication Data

US 2024/0387100 A1 Nov. 21, 2024

(51) Int. Cl.

*H01F 27/32* (2006.01)
*H01F 27/28* (2006.01)
*H03K 17/56* (2006.01)

(52) U.S. Cl.

CPC ....... *H01F 27/325* (2013.01); *H01F 27/2876* (2013.01); *H03K 17/56* (2013.01)

(58) Field of Classification Search

CPC ............... H01F 27/325; H01F 27/2876; H01F 2003/103; H01F 3/10; H01F 27/08; H01F 37/00; H01F 38/00; H03K 17/56

See application file for complete search history.

(56) References Cited

U.S. PATENT DOCUMENTS

| | | | |
|---|---|---|---|
| 3,668,483 | A | 6/1972 | Kellenbenz |
| 4,723,188 | A | 2/1988 | Mcmurray |
| 6,104,106 | A | 8/2000 | Partridge |
| 6,801,433 | B2 | 10/2004 | Lindholm et al. |
| 9,004,892 | B2 | 4/2015 | Wang |

(Continued)

FOREIGN PATENT DOCUMENTS

| | | | | |
|---|---|---|---|---|
| CN | 103633632 A * | 3/2014 | | |
| CN | 112750600 A * | 5/2021 | ............... | H10D 1/20 |

(Continued)

OTHER PUBLICATIONS

Study of the Influence of Ferromagnetic Material, EPE2012 (Year: 2012).*

(Continued)

*Primary Examiner* — Crystal L Hammond
*Assistant Examiner* — Samantha L Faubert
(74) *Attorney, Agent, or Firm* — CANTOR COLBURN LLP

(57) ABSTRACT

A solid-state circuit breaker (SSCB) is provided. The SSCB includes an electrical circuit. The electrical circuit includes inductor electrical connections, a diode rectifier bridge that drives current, which enters the electrical circuit in first or second directions, across the inductor electrical connections in only one of the first direction or the second direction and an inductor. The inductor is electrically interposed between the inductor electrical connections. The inductor includes a permanent magnet arrangement configured to introduce flux pre-bias for maintaining the inductor in an out-of-saturation condition during a peak fault event.

19 Claims, 4 Drawing Sheets

(56) References Cited

U.S. PATENT DOCUMENTS

| | | | | |
|---|---|---|---|---|
| 9,368,267 | B2 | 6/2016 | Motto et al. | |
| 9,755,630 | B2 | 9/2017 | Urciuoli | |
| 9,985,430 | B2 | 5/2018 | Hall | |
| 10,389,104 | B1 | 8/2019 | Corzine | |
| 10,424,437 | B2 | 9/2019 | Cheer et al. | |
| 10,580,601 | B2 | 3/2020 | Waag | |
| 10,644,500 | B2 | 5/2020 | Papini et al. | |
| 11,121,539 | B2 | 9/2021 | Li et al. | |
| 11,289,252 | B2 * | 3/2022 | Lee | H01F 41/0226 |
| 11,356,080 | B2 | 6/2022 | Kuznetsov | |
| 11,538,650 | B1 | 12/2022 | Yang | |
| 11,862,416 | B2 * | 1/2024 | Leusenkamp | H01H 9/542 |
| 2008/0012680 | A1 | 1/2008 | Muelleman | |
| 2013/0187738 | A1 | 7/2013 | Pal et al. | |
| 2018/0138689 | A1 | 5/2018 | Wu et al. | |
| 2021/0257832 | A1 | 8/2021 | Du et al. | |
| 2023/0091720 | A1 * | 3/2023 | Rahman | H01L 23/427 257/713 |
| 2024/0153694 | A1 * | 5/2024 | Canete Cabeza | H01F 27/24 |

FOREIGN PATENT DOCUMENTS

| | | | | |
|---|---|---|---|---|
| EP | 3321949 | A1 | | 5/2018 |
| GB | 2548737 | B | | 2/2018 |
| JP | 2014087076 | A | | 5/2014 |
| JP | 2024046847 | A | * | 4/2024 |
| WO | 2022258225 | A1 | | 12/2022 |

OTHER PUBLICATIONS

European Search Report for Application No. 24163489.8, mailed Sep. 24, 2024, 13 pages.

Partial Search Report issued in European Patent Application No. 24163489.8; Application Filing Date Mar. 14, 2024; Date of Mailing Jul. 1, 2024 (14 pages).

Aguilar et al. "Size reduction of a DC link choke using saturation-gap and biasing with permanent magnets" PCIM Europe 2014; Intl. Exhibition and Conference for Power Electronics, Intelligent Motion, Renewable Energy and Energy Management (2014) pp. 1-9.

Armstrong et al. "Architecture, voltage and components for a turboelectric distributed propulsion electric grid" NASA (Jul. 2015) pp. 1-270.

Dang et al "Evaluation of high-current toroid power inductor with NdFeB magnet for DC-DC power converters" IEEE Transactions on Industrial Electronics 62.11 (Nov. 2015) pp. 6868-6876.

Lewinsohn "High-efficiency, ceramic microchannel heat exchangers" Am. Ceram. Soc. Bull 94.5 (2015) pp. 26-31.

Mukhopadhyay et al. "A novel compact magnetic current limiter for three phase applications" IEEE Transactions on Magnetics 36.5 (Aug. 2002) pp. 3568-3570.

Yang et al. "Permanent Magnet Hybrid Core Inductors for High Saturation Capability" 2022 IEEE 23rd Workshop on Control and Modeling for Power Electronics (COMPEL) pp. 1-12.

Zhou et al. "Inductive fault current limiters in VSC-HVDC systems: A review" IEEE Access 8 (Feb. 2020) pp. 38185-38197.

* cited by examiner

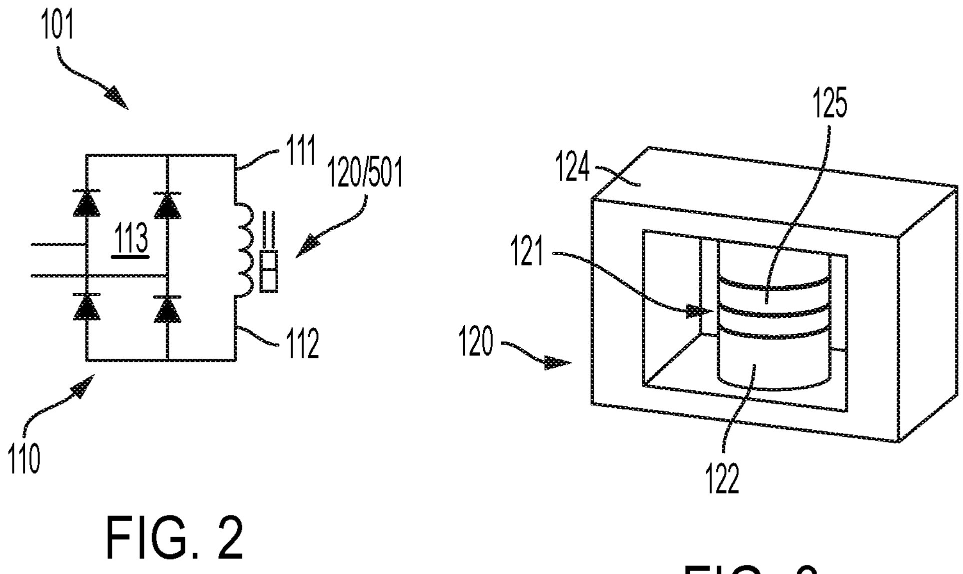
FIG. 2
FIG. 3
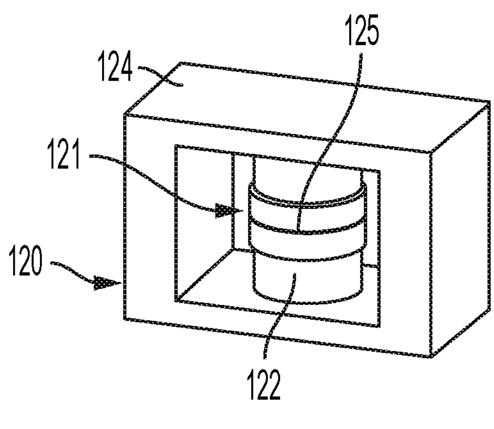
FIG. 4

INDUCTORS FOR DIRECT CURRENT (DC) CIRCUIT BREAKERS IN AIRCRAFT APPLICATIONS

STATEMENT OF FEDERAL SUPPORT

This invention was made with Government support under Contract No. NNC15BA06B awarded by National Aeronautics and Space Administration (NASA). The Government has certain rights in the invention.

BACKGROUND

The present disclosure relates to inductors and, in particular, to inductors for direct current (DC) circuit breakers in aircraft applications.

A circuit breaker is an electrical safety device designed to protect an electrical circuit from damage caused by overcurrent. The basic function of a circuit breaker is to interrupt current flow to protect equipment and to prevent the risk of fire. Unlike a fuse, which operates once and then must be replaced, a circuit breaker can be reset (either manually or automatically) to resume normal operations.

Solid-state circuit breakers (SSCBs), also known as digital circuit breakers, are a technological innovation which promises to advance circuit breaker technology out of the mechanical level and into the electrical domain. This will offer several advantages including, but not limited to, cutting circuitry in fractions of microseconds, improved monitoring of circuit loads and longer lifetimes.

SUMMARY

According to an aspect of the disclosure, a solid-state circuit breaker (SSCB) is provided. The SSCB includes an electrical circuit. The electrical circuit includes inductor electrical connections, a diode rectifier bridge that drives current, which enters the electrical circuit in first or second directions, across the inductor electrical connections in only one of the first direction or the second direction and an inductor. The inductor is electrically interposed between the inductor electrical connections. The inductor includes a permanent magnet arrangement configured to introduce flux pre-bias for maintaining the inductor in an out-of-saturation condition during a peak fault event.

In accordance with additional or alternative embodiments, the permanent magnet arrangement is disposed in series with magnetic flux in the inductor.

In accordance with additional or alternative embodiments, the permanent magnet arrangement is disposed in parallel with magnetic flux in the inductor.

In accordance with additional or alternative embodiments, the inductor includes a bobbin, a winding wound around the bobbin, a magnetic core disposed about the bobbin and a north-south permanent magnet pair disposed in series or in parallel with magnetic flux in the inductor.

In accordance with additional or alternative embodiments, the north-south permanent manet pair disposed in series with the magnetic flux is disposed along a longitudinal axis of the bobbin.

In accordance with additional or alternative embodiments, the north-south permanent manet pair disposed in parallel with the magnetic flux is disposed about a longitudinal axis of the bobbin.

In accordance with additional or alternative embodiments, the bobbin includes ceramic materials.

In accordance with additional or alternative embodiments, the ceramic materials include alumina.

In accordance with additional or alternative embodiments, the bobbin includes one or more base elements defining microchannels.

In accordance with additional or alternative embodiments, the microchannels are oriented transversely relative to a longitudinal axis of the bobbin.

In accordance with additional or alternative embodiments, the bobbin includes bobbin channels into each of which a corresponding portion of the winding is disposable with an absence of insulation.

In accordance with additional or alternative embodiments, the bobbin channels are arranged in a pattern of concentric rings.

According to an aspect of the disclosure, a bobbin of an inductor of a solid-state circuit breaker (SSCB) is provided. The bobbin base elements and bobbin channels interposed between the base elements to extend along a longitudinal axis defined to extend between the base elements. Each of the bobbin channels is receptive of a corresponding portion of a winding with an absence of insulation.

In accordance with additional or alternative embodiments, the base elements and the bobbin channels includes ceramic materials.

In accordance with additional or alternative embodiments, the ceramic materials include alumina.

In accordance with additional or alternative embodiments, the base elements define microchannels.

In accordance with additional or alternative embodiments, the microchannels are oriented transversely relative to the longitudinal axis.

In accordance with additional or alternative embodiments, the bobbin channels are arranged in a pattern of concentric rings.

According to an aspect of the disclosure, a solid-state circuit breaker (SSCB) is provided. The SSCB includes an electrical circuit. The electrical circuit includes inductor electrical connections, a diode rectifier bridge that drives current, which enters the electrical circuit in first or second directions, across the inductor electrical connections in only one of the first direction or the second direction, and a coreless inductor. The coreless inductor is electrically interposed between the inductor electrical connections and is configured to introduce flux pre-bias for maintaining the coreless inductor in an out-of-saturation condition during a peak fault event. The coreless inductor includes a winding, a ferromagnetic fluid circuit configured to flow a ferromagnetic fluid through the winding and a heat exchanger configured to remove heat from the ferromagnetic fluid.

In accordance with additional or alternative embodiments, the SSCB further includes a ceramic bobbin in which the winding is supportively disposed.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE DRAWINGS

For a more complete understanding of this disclosure, reference is now made to the following brief description, taken in connection with the accompanying drawings and detailed description, wherein like reference numerals represent like parts:

FIG. 2 is an electrical circuit diagram of an inductor of an SSCB in accordance with embodiments;

FIG. 3 is a mechanical perspective view of the inductor of the SSCB of FIG. 2 using E-core shape soft magnetic cores in accordance with embodiments;

FIG. 4 is an alternate mechanical perspective view of the inductor of the SSCB of FIG. 2 in accordance with embodiments;

DETAILED DESCRIPTION

SSCBs must meet fast response time and power density requirements for hybrid propulsion applications. To achieve this, SSCBs will generally require inductors to limit a rate of rise of fault currents. Inductor designs for SSCBs can be challenging to design, however, since components must operate at nominal steady state DC current as well as high instantaneous peak current during fault events. It is thus essential to minimize power losses and to protect inductor soft magnetic core material from saturation.

As will be described below, magnetic cores of DC inductors of SSCBs can be biased with permanent magnets to extend peak saturation current. This flux biasing can help to keep the inductor out of saturation during peak fault events. The flux biasing can be accomplished by placing permanent magnets directly in the flux path of the fault current (see FIG. 3) or adjacent to the flux path (see FIG. 4). Ceramic bobbins (made from alumina or other similar composites) can be used to place or position the copper foil windings without need for any foil insulation. A bottom surface of the bobbin can have microchannels for cooling. A conventional magnetic core can be entirely or almost entirely eliminated by using ferromagnetic liquid as a distributed airgap to enhance and corral magnetic fields within the winding. The ferromagnetic liquid can also act as coolant, removing heat from the copper foil winding through the ceramic bobbin walls.

Figure 1:
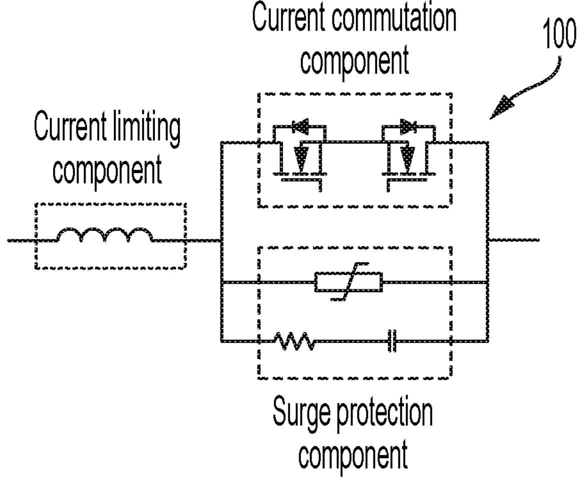
FIG. 1 is a schematic circuit diagram of an SSCB in accordance with embodiments.

With reference to FIG. 1, FIG. 2 and with reference to FIGS. 3 and 4, an SSCB 101 is provided (see FIG. 2). The SSCB 101 of FIG. 2 includes an electrical circuit 110 and an inductor 120. The electrical circuit 110 includes inductor electrical connections 111 and 112 as well as a diode rectifier bridge 113.

A conventional SSCB is designed to operate and break fault current regardless of the current direction through the circuit breaker 100 (see FIG. 1). Since permanent magnets have a fixed magnetic flux direction, if these magnets are incorporated into inductor cores, the current direction through the current limiting inductor must be regulated to always flow in one direction such that the fault current magnetic flux is in opposition to the permanent magnet flux. This can be achieved by mechanical arrangement of permanent magnets and an inductor winding or by adding an additional diode rectifier bridge in the electrical path of the inductor winding. The SSCB 101 of FIG. 2 differs from the conventional SSCB as described below.

As shown in FIG. 2, the diode rectifier bridge 113 drives current, which enters the electrical circuit 110 in first or second directions, across the inductor electrical connections 111 and 112 in only one of the first direction or the second direction. The inductor 120 is electrically interposed between the inductor electrical connections 111 and 112 and includes a permanent magnet arrangement 121.

As shown in FIG. 3, the permanent magnet arrangement 121 can be disposed in series with magnetic flux in the inductor 120 to introduce flux pre-bias for maintaining the inductor 120 in an out-of-saturation condition during a peak fault event.

As shown in FIG. 4, the permanent magnet arrangement 121 can be disposed is parallel with magnetic flux in the inductor 120 to introduce flux pre-bias for maintaining the inductor 120 in an out-of-saturation condition during a peak fault event.

Figure 5:
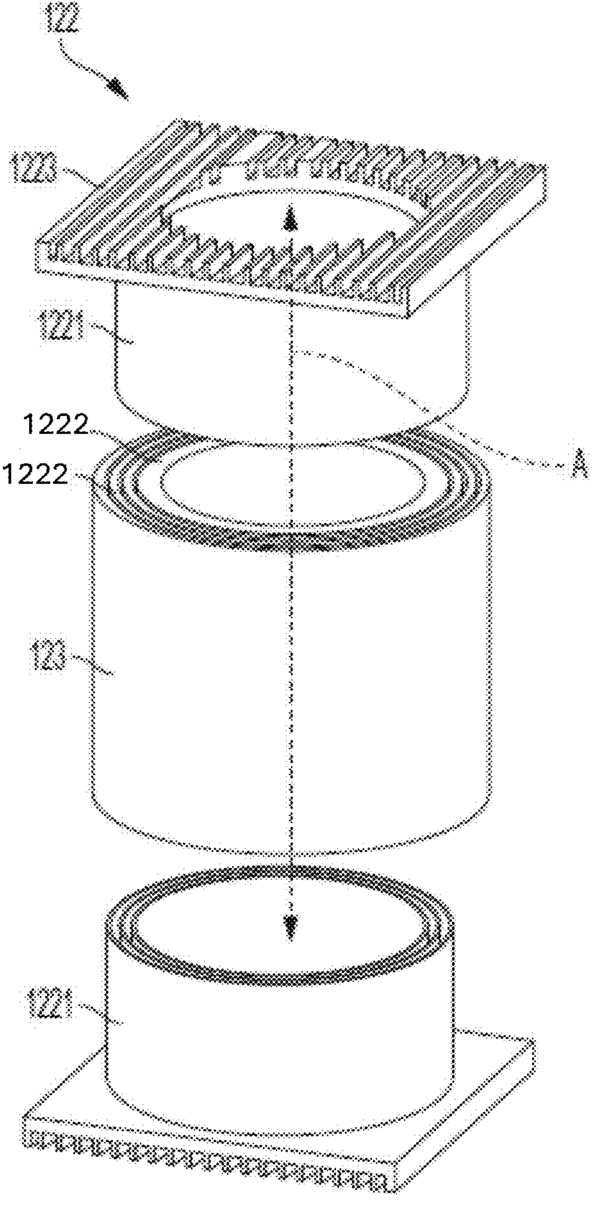
FIG. 5 is a perspective view of a bobbin of the inductor of FIGS. 2 and 3 in accordance with embodiments.

With continued reference to FIGS. 3 and 4 and with additional reference to FIG. 5, the inductor 120 includes a bobbin 122, a winding 123 (see FIG. 5) that is wound around the bobbin 122, a magnetic core 124 disposed about the bobbin 122 and a north-south permanent magnet pair 125. Several features of the inductor 120 (i.e., the bobbin 122) can be formed by an additive manufacturing process. The bobbin 122 can include or be formed of ceramic materials, such as, but not limited to, alumina or other similar materials. The bobbin 122 can include one or more base elements 1221 and bobbin channels 1222. The one or more base elements 1221 can be formed to define microchannels 1223 for increased surface area for cooling. The microchannels 1223 can be transversely oriented relative to a longitudinal axis A of the bobbin 122. The longitudinal axis A can be defined such that the longitudinal axis A extends between the one or more base elements 1221 in a straight line that is at a normal (right) angle to each of the one or more base elements 1221 as shown in FIG. 5. The bobbin channels 1222 can be provided as an array of concentric rings and a corresponding portion of the winding 123 can be disposed in each of the bobbin channels 1222 with an absence of insulation, which is not needed due to the dielectric characteristics of the ceramic material of the bobbin 122.

Where the permanent magnet arrangement 121 is disposed is series with the magnetic flux in the inductor 120 as shown in FIG. 3, the north-south permanent magnet pair 125 can be disposed along the longitudinal axis A of the bobbin 122. Where the permanent magnet arrangement 121 is disposed is parallel with the magnetic flux in the inductor 120 as shown in FIG. 4, the north-south permanent magnet pair 125 can be disposed about the longitudinal axis A of the bobbin 122.

Figure 6:
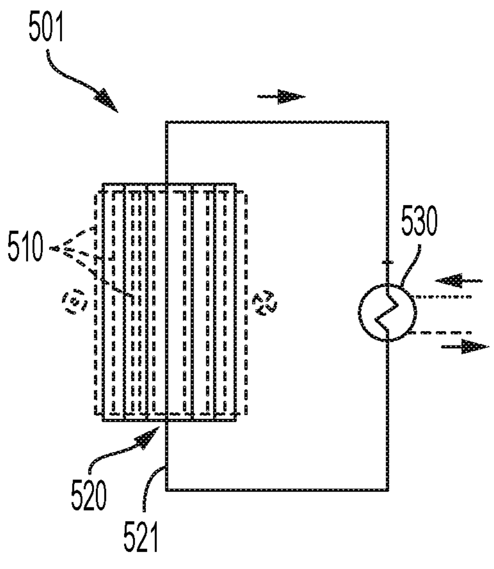
FIG. 6 is a mechanical view of a coreless inductor of an SSCB in accordance with embodiments.
Figure 7:
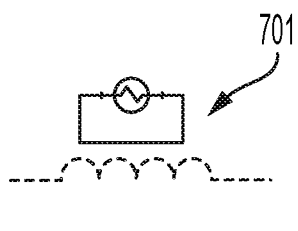
FIG. 7 is an equivalent electrical schematic of the coreless inductor in accordance with embodiments.

With reference back to FIG. 2 and with additional reference to FIG. 6 and FIG. 7, the soft magnetic inductor core can be entirely eliminated and a fully coreless ferromagnetic liquid core can be used for the inductor winding. As shown in FIG. 6, the coreless inductor 501 includes a winding 510, a ferromagnetic fluid circuit 520 that is configured to flow a ferromagnetic fluid 521 through the winding 510, such that the winding 510 is effectively embodied as the ferromagnetic fluid 521, and a heat exchanger 530 that is configured to remove heat from the ferromagnetic fluid 521. The coreless inductor 501 can also include a ceramic bobbin (see, e.g., the bobbin 122 of FIG. 5) in which the winding 510 is supportively disposed. The winding 510 (i.e., the ferromagnetic fluid 521) receives current applied thereto by the electrical circuit 701 of FIG. 7.

Technical effects and benefits of the present disclosure are the provision of biased inductors that will be smaller in size and lighter for same or similar flux densities as compared to conventional cores. Additive manufacturing techniques will allow novel core shapes and better control of magnetic circuitry to prevent saturation regions and/or high-loss regions. Ceramic bobbins remove heat more efficiently than other types of bobbins, which will help in the reduction of the sizes of the inductors. Moreover, there will be an ability to change inductance and magnetic properties of inductors by changing ferromagnetic liquid properties or cooling orientations or designs. The distributed air gap of the ferromagnetic liquid resists magnetic saturation for peak fault current.

The corresponding structures, materials, acts and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A solid-state circuit breaker (SSCB), comprising:
an electrical circuit comprising:
a number of inductor electrical connections;
a diode rectifier bridge that drives current, which enters the electrical circuit in first or second directions, across the inductor electrical connections in only one of the first direction or the second direction; and
an inductor electrically interposed between the inductor electrical connections,
the inductor comprising a permanent magnet arrangement configured to introduce flux pre-bias for maintaining the inductor in an out-of-saturation condition during a peak fault event,
wherein:
the inductor comprises a bobbin comprising base elements at opposite longitudinal ends thereof, a magnetic core disposed about the bobbin and a permanent magnet pair disposed in series or in parallel with magnetic flux in the inductor, and
the magnetic core comprises first portions at the opposite longitudinal ends and second and third portions extending between the first portions at first and second sides of the bobbin, respectively.

2. The SSCB according to claim 1, wherein the permanent magnet arrangement is disposed in series with magnetic flux in the inductor.

3. The SSCB according to claim 1, wherein the permanent magnet arrangement is disposed in parallel with magnetic flux in the inductor.

4. The SSCB according to claim 1, wherein the permanent magnet pair is a north-south permanent magnet pair disposed in series with the magnetic flux is disposed along a longitudinal axis of the bobbin.

5. The SSCB according to claim 1, wherein the permanent magnet pair is a north-south permanent magnet pair disposed in parallel with the magnetic flux is disposed about a longitudinal axis of the bobbin.

6. The SSCB according to claim 1, wherein the first, second and third portions of the bobbin comprise ceramic materials.

7. The SSCB according to claim 6, wherein the ceramic materials comprise alumina.

8. The SSCB according to claim 1, wherein the base elements define microchannels.

9. The SSCB according to claim 8, wherein the microchannels are oriented transversely relative to a longitudinal axis of the bobbin.

10. The SSCB according to claim 1, wherein the bobbin comprises bobbin channels into each of which a corresponding portion of a winding, which is wound around the bobbin, is disposable with an absence of insulation.

11. The SSCB according to claim 10, wherein the bobbin channels are arranged in a pattern of concentric rings.

12. A bobbin of an inductor of a solid-state circuit breaker (SSCB), the bobbin comprising:
base elements; and
bobbin channels interposed between the base elements to extend along a longitudinal axis defined to extend between the base elements,
each of the bobbin channels being receptive of a corresponding portion of a winding with an absence of insulation,
wherein the bobbin comprises a magnetic core and a north-south permanent magnet pair disposed in series or in parallel with magnetic flux in the inductor, the base elements are at opposite longitudinal ends of the bobbin and the magnetic core comprises:
first portions at the opposite longitudinal ends of the bobbin;
second portions extending between first corresponding ends of the first portions at a first side of the bobbin; and
third portions extending between second corresponding ends of the first portions at a second side of the bobbin.

13. The bobbin according to claim 12, wherein the base elements and the bobbin channels comprise ceramic materials.

14. The bobbin according to claim 13, wherein the ceramic materials comprise alumina.

15. The bobbin according to claim 12, wherein the base elements define microchannels.

16. The bobbin according to claim 15, wherein the microchannels are oriented transversely relative to the longitudinal axis.

17. The bobbin according to claim 12, wherein the bobbin channels are arranged in a pattern of concentric rings.

18. A solid-state circuit breaker (SSCB), comprising:
an electrical circuit comprising:
a number of inductor electrical connections;
a diode rectifier bridge that drives current, which enters the electrical circuit in first or second directions, across the inductor electrical connections in only one of the first direction or the second direction; and
a coreless inductor electrically interposed between the inductor electrical connections and is configured to introduce flux pre-bias for maintaining the coreless inductor in an out-of-saturation condition during a peak fault event, the coreless inductor comprising:

a winding;

a ferromagnetic fluid circuit configured to flow a ferromagnetic fluid through the winding; and a heat exchanger configured to remove heat from the ferromagnetic fluid.

19. The SSCB according to claim 18, further comprising a ceramic bobbin in which the winding is supportively disposed.

* * * * *